(12) United States Patent
Nagano et al.

(10) Patent No.: US 6,825,408 B2
(45) Date of Patent: Nov. 30, 2004

(54) STACKED PHOTOELECTRIC CONVERSION DEVICE

(75) Inventors: Yasue Nagano, Sakurai (JP); Naoki Koide, Kitakatsuragi-gun (JP); Takanori Nakano, Kashiba (JP); Mingju Yang, Yamatotakada (JP); Yuji Komatsu, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 94 days.

(21) Appl. No.: 10/224,335

(22) Filed: Aug. 21, 2002

(65) Prior Publication Data
US 2003/0111106 A1 Jun. 19, 2003

(30) Foreign Application Priority Data
Aug. 24, 2001 (JP) .......................................... 2001-255131

(51) Int. Cl.$^7$ ............................................. H01L 31/052
(52) U.S. Cl. ....................... 136/246; 136/249; 136/256; 136/258; 136/252; 257/436; 257/466; 257/443
(58) Field of Search ................................ 136/249, 246, 136/256, 258, 252; 257/436, 466, 443

(56) References Cited

U.S. PATENT DOCUMENTS

| | | | | |
|---|---|---|---|---|
| 5,977,477 A | * | 11/1999 | Shiozaki | 136/256 |
| 6,150,605 A | * | 11/2000 | Han | 136/263 |
| 6,459,034 B2 | * | 10/2002 | Muramoto et al. | 136/249 |
| 6,506,622 B1 | * | 1/2003 | Shiozaki | 438/73 |
| 2002/0050289 A1 | * | 5/2002 | Wada et al. | 136/256 |
| 2002/0134425 A1 | * | 9/2002 | Yamamoto et al. | 136/255 |

FOREIGN PATENT DOCUMENTS

| | | |
|---|---|---|
| JP | 2738557 | 1/1998 |
| JP | 11-214728 | 8/1999 |

* cited by examiner

*Primary Examiner*—Alan Diamond
(74) *Attorney, Agent, or Firm*—Nixon & Vanderhye P.C.

(57) ABSTRACT

A stacked photoelectric conversion device comprising at least two photoelectric conversion element layers sandwiched between a first electrode layer and a light receiving second electrode layer, and at least one intermediate layer sandwiched between any two of said at least two photoelectric conversion element layers, wherein the intermediate layer has uneven surfaces on a light receiving side and a light outgoing side, the uneven surface on the latter having a greater average level difference than that on the former.

16 Claims, 3 Drawing Sheets

STACKED PHOTOELECTRIC CONVERSION DEVICE

CROSS-REFERENCE TO RELATED APPLICATION

This application is related to Japanese Patent Application No. 2001-255131 filed on Aug. 24, 2001, whose priority is claimed under 35 USC § 119, the disclosure of which is incorporated by reference in its entirety.

BACKGROUND OF THE INVENTION

1. Field of the Invention

The present invention relates to a stacked photoelectric conversion device including a plurality of photoelectric conversion element layers. The stacked photoelectric conversion device can effectivery utilize light of wavelengths in a greater region, and therefore can suitably be used as a stacked solar cell.

2. Description of Related Art

A silicon solar cell utilizing a crystalline silicon substrate has currently been in a mainstream. However, a thin film solar cell including a thin silicon film deposited on a glass or metal plate is now under development with the aim of reducing the manufacture cost and the usage of silicon materials. On the other hand, from the viewpoint of the device structure, a stacked solar cell is also under development to improve photoelectric conversion efficiency and reduce the cost per power generation output.

The stacked solar cell includes a plurality of photoelectric conversion element layers (pn junction layers, or simply referred to as "photoelectric conversion elements") which are stacked and electrically connected in series. In general, semiconductor materials functioning as the photoelectric conversion elements are arranged in descending order of semiconductor band gap (Eg) from the light receiving side. This structure allows the stacked solar cell to absorb light of wider range from short wavelengths to long wavelengths. An output voltage is obtained as the sum of outputs of the photoelectric conversion elements and a current value decreases, so that loss of internal resistance is reduced by a large amount.

In the stacked solar cell, incident light such as solar light passes through the stacked photoelectric conversion elements while being absorbed in increasing order of wavelength. Therefore, structure design and manufacture steps of the elements are greatly complicated as compared with a solar cell of unijunction structure. Especially, since the photoelectric conversion elements are serially connected, electric current generated during the operation of the stacked solar cell is limited by short circuit current density of a part of the photoelectric conversion elements which generates the lowest current. Therefore, it is quite difficult to obtain high photoelectric conversion efficiency.

In this connection, Japanese Unexamined Patent Publication No. Hei 11 (1999)-214728 proposes a stacked photoelectric conversion device in which a textured structure (i.e., an uneven surface) is adopted. More specifically, this is a tandem-type (stacked) thin silicon film photoelectric conversion device comprising a first photoelectric conversion unit made of a thin silicon film containing a microcrystalline silicon substance and a second photoelectric conversion unit made of a thin amorphous silicon germanium film (on the light receiving side), wherein the first photoelectric conversion unit includes a textured structure, i.e., fine unevenness provided on the upper surface thereof. This photoelectric conversion device is intended to both of cost reduction and improvement in performance.

According to this prior art, it may be expected that the fine unevenness on the upper surface of the first photoelectric conversion unit brings an optical confinement effect, i.e., an increase in optical path length in the second photoelectric conversion unit. However, interface reflection cannot be expected because refractive indices of the first and second photoelectric conversion units are very close. Therefore, light incident on and passed through the second photoelectric conversion unit without being absorbed therein is not reflected at the interface, and therefore incident on and absorbed in the first photoelectric conversion unit. This is problematic because the short circuit current density of the stacked solar cell is limited depending upon the light absorption ability of the second photoelectric conversion unit.

Further, Japanese Patent No. 2738557 discloses a multilayered solar cell having an intermediate layer (selective reflection film) inserted between the photoelectric conversion elements. The thickness of the intermediate layer is appropriately selected such that incident light is selectively reflected or passes through in accordance with the wavelengths matching with spectral sensitivities of the photoelectric conversion elements. However, according to this prior art, there is no consideration to the unevenness on the surface of the intermediate layer inserted between the photoelectric conversion layers. Therefore, it is not expected that the short circuit current density increases due to the increase in optical path length in the photoelectric conversion element.

SUMMARY OF THE INVENTION

An object of the present invention is to provide a stacked photoelectric conversion device which has electric characteristics improved by increasing external current density and thus is suitably used as a stacked solar cell.

According to the present invention, provided is a stacked photoelectric conversion device comprising at least two photoelectric conversion element layers sandwiched between a first electrode layer and a light receiving second electrode layer, and at least one intermediate layer sandwiched between any two of said at least two photoelectric conversion element layers, wherein the intermediate layer has uneven surfaces on a light receiving side and a light outgoing side, the uneven surface on the latter having a greater average level difference than that on the former.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

First, a relationship between the uneven surface of the intermediate layer and the short circuit current density of the photoelectric conversion element layer adjacent thereto is explained below with reference to the results of preliminary experiments performed by the inventors of the present invention.

In the following explanation, the photoelectric conversion element layer adjacent to the first electrode layer side of the intermediate layer is referred to as "a first photoelectric conversion element layer" and that adjacent to the second electrode layer side of the intermediate layer is referred to as "a second photoelectric conversion element layer".

Between the first and second photoelectric conversion element layers, the intermediate layer having an uneven surface on the light receiving side is inserted. This allows increase in interface reflection and optical path length, and therefore improves the short circuit current density of the second photoelectric conversion element layer. However, since light of long wavelengths which is required for the first photoelectric conversion element layer is also reflected at an interface between the intermediate layer and the first photoelectric conversion element layer, a sufficient amount of light does not enter the first photoelectric conversion element layer. This fact was confirmed through the experiments.

Figure 3:
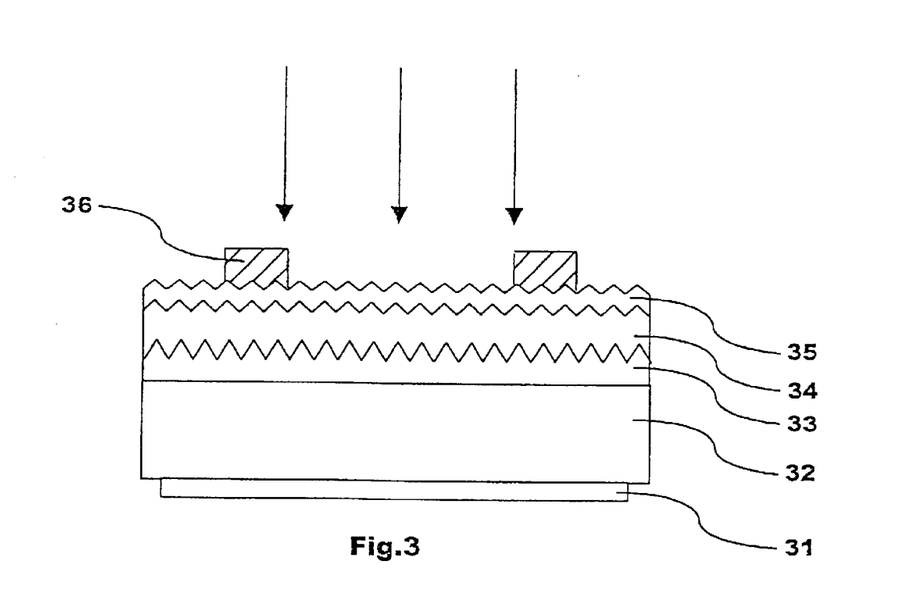
FIG. 3 is a schematic sectional view illustrating a stacked photoelectric conversion device used in preliminary experiments for evaluating the stacked photoelectric conversion device.
Figure 4:
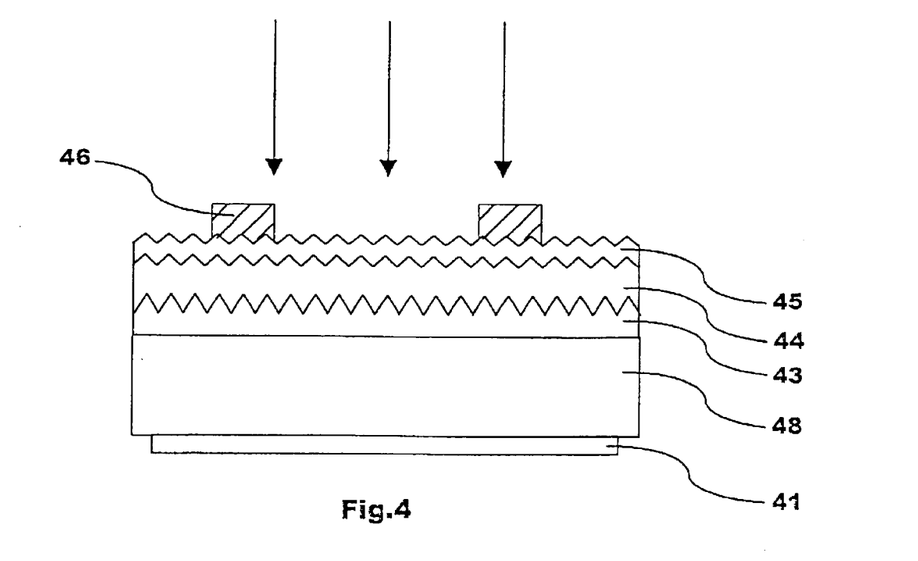
FIG. 4 is a schematic sectional view illustrating a stacked photoelectric conversion device used in the preliminary experiments for evaluating a second photoelectric conversion element layer.

More specifically, stacked photoelectric conversion devices as shown in FIG. 3 were manufactured such that each of the devices included an uneven surface having different average level difference (Ry) on the light receiving side of the intermediate layer. Then, the short circuit current densities of the stacked photoelectric conversion devices were measured, respectively. On the other hand, stacked photoelectric conversion devices as shown in FIG. 4 were manufactured by using a silicon substrate instead of the first photoelectric conversion element layer. Each of the devices included an uneven surface having different average level difference (Ry) on the light receiving side of the intermediate layer. Then, the short circuit current densities of the second photoelectric conversion element layers were measured, respectively. The obtained results are shown in Table 1.

The average level difference mentioned herein is the one defined by JIS B0601 (maximum height; may be referred to as Ry or Rmax). That is, it signifies a value expressed by $\mu$m which is obtained by extracting a reference length (generally selected from 0.08 mm, 0.25 mm, 0.8 mm, 2.5 mm, 8 mm and 25 mm) from a roughness curve in the direction of an average line and measuring an interval between a peak line and a bottom line in the extracted reference length in the direction of depth magnification of the roughness curve.

FIG. 3 is a schematic sectional view illustrating a stacked photoelectric conversion device used in the preliminary experiments for evaluating the stacked photoelectric conversion device. From the opposite side of the light receiving side, a first electrode layer 31, a first photoelectric conversion element layer 32, an intermediate layer 33 having an uneven surface on the light receiving side, a second photoelectric conversion element layer 34, a second electrode layer 35 and a comb-shaped electrode 36 are stacked in this order. Arrows in the figure signify light. FIG. 4 is a schematic sectional view illustrating a stacked photoelectric conversion device used in the preliminary experiments for evaluating the second photoelectric conversion element layer. From the opposite side of the light receiving side, a first electrode layer 41, a silicon substrate 48, an intermediate layer 43 having an uneven surface on the light receiving side, a second photoelectric conversion element layer 44, a second electrode layer 45 and a comb-shaped electrode 46 are stacked in this order. Arrows in the figure signify light.

TABLE 1

| | Short circuit current density (mA/cm$^2$) | |
|---|---|---|
| Ry of intermediate layer ($\mu$m) | Stacked photoelectric conversion device | Second photoelectric conversion element layer |
| 0 | 12.0 | 12.0 |
| 0.1 | 13.0 | 13.4 |
| 0.3 | 13.4 | 13.9 |
| 0.5 | 13.3 | 14.1 |
| 0.7 | 13.3 | 13.8 |
| 1.0 | 13.3 | 13.5 |
| 1.5 | 12.7 | 12.7 |

From the results shown in Table 1, it is found that the short circuit current density of the second photoelectric conversion element layer is improved by optimizing Ry of the uneven surface on the light receiving side of the intermediate layer, whereas that of the stacked photoelectric conversion device is not improved as the second photoelectric conversion element layer. That is, the short circuit current density of the stacked photoelectric conversion device is limited by that of the first photoelectric conversion element layer.

Next, preliminary experiments were carried out with respect to stacked photoelectric conversion devices in which the first photoelectric conversion element layer had an uneven surface on the light receiving side for the purpose of decreasing reflection of light of long wavelengths and the intermediate layer was inserted.

Figure 5:
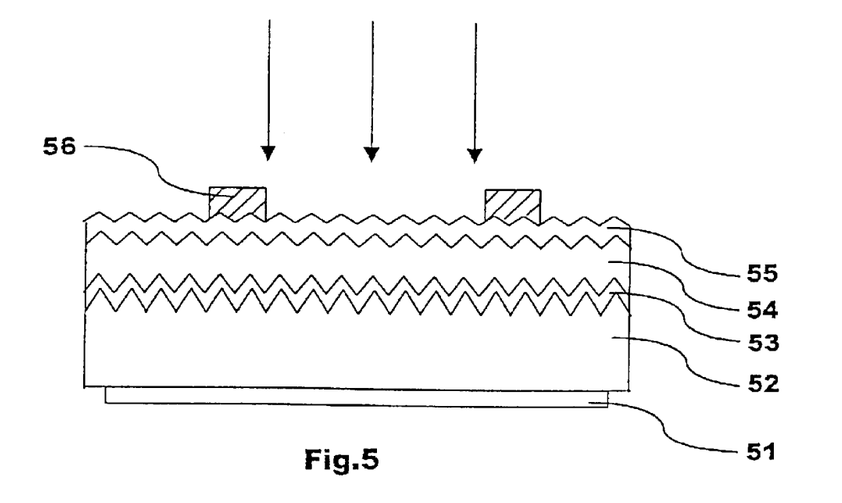
FIG. 5 is a schematic sectional view illustrating a stacked photoelectric conversion device used in the preliminary experiments for evaluating the photoelectric conversion device.
Figure 6:
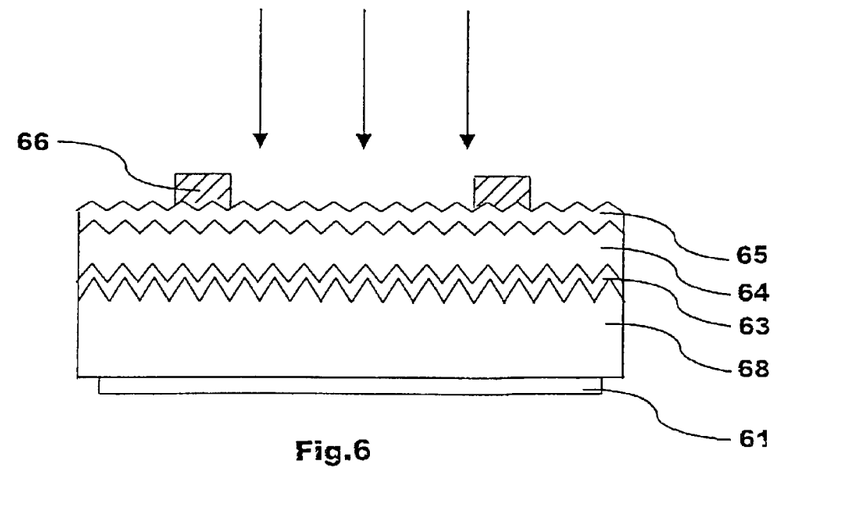
FIG. 6 is a schematic sectional view illustrating a stacked photoelectric conversion device used in the preliminary experiments for evaluating a second photoelectric conversion element layer.

More specifically, stacked photoelectric conversion devices as shown in FIG. 5 were manufactured such that each of the devices included an uneven surface having different average level difference (Ry) on the light receiving side of the first photoelectric conversion element layer. Then, the short circuit current densities of the stacked photoelectric conversion devices were measured, respectively. On the other hand, stacked photoelectric conversion devices as shown in FIG. 6 were manufactured by using a silicon substrate instead of the first photoelectric conversion element layer. Each of the devices included an uneven surface having different average level difference (Ry) on the light receiving side of the intermediate layer. Then, the short circuit current densities of the second photoelectric conversion element layers were measured, respectively. The obtained results are shown in Table 2.

FIG. 5 is a schematic sectional view illustrating a stacked photoelectric conversion device used in the preliminary experiments for evaluating the photoelectric conversion device. From the opposite side of the light receiving side, a first electrode layer 51, a first photoelectric conversion element layer 52 having an uneven surface on the light receiving side, an intermediate layer 53, a second photoelectric conversion element layer 54, a second electrode layer 55 and a comb-shaped electrode 56 are stacked in this order. Arrows in the figure signify light. The intermediate layer 53 has a thickness of 80 nm and an uneven surface is not formed positively on the light receiving side.

FIG. 6 is a schematic sectional view illustrating a stacked photoelectric conversion device used in the preliminary experiments for evaluating the second photoelectric conversion element layer. From the opposite side of the light receiving side, a first electrode layer 61, a silicon substrate 68 having an uneven surface on the light receiving side, an intermediate layer 63 of 80 nm thick, a second photoelectric conversion element layer 64, a second electrode layer 65 and a comb-shaped electrode 66 are stacked in this order. Arrows in the figure signify light. The intermediate layer 63 has a thickness and an uneven surface is not formed positively on the light receiving side.

TABLE 2

| Ry of first photoelectric conversion element layer (μm) | Short circuit current density (mA/cm²) | |
|---|---|---|
| | Stacked photoelectric conversion device | Second photoelectric conversion element layer |
| 0 | 12.0 | 12.0 |
| 1 | 13.4 | 13.4 |
| 10 | 13.7 | 13.7 |
| 50 | 13.6 | 13.6 |
| 100 | 13.6 | 13.6 |
| 150 | 13.4 | 13.5 |

From the results shown in Table 2, it is found that reflection of light of long wavelengths is reduced by forming the uneven surface on the light receiving side of the first photoelectric conversion element layer. This increases the amount of light incident on the first photoelectric conversion element layer, and therefore improves the short circuit current density of the stacked photoelectric conversion device. However, since the short circuit current density of the second photoelectric conversion element layer and that of the stacked photoelectric conversion device are substantially the same, it is understood that the short circuit current density of the stacked photoelectric conversion device is limited by the second photoelectric conversion device.

From the results of the preliminary experiments, it is confirmed that the short circuit current density of the second photoelectric conversion element layer is improved by inserting the intermediate layer having the uneven surface on the light receiving side between the first and second photoelectric conversion element layers. Further, the short circuit current density of the first photoelectric conversion element layer is also improved by reducing the reflection of light of long wavelengths by forming the uneven surface on the light receiving side of the first photoelectric conversion element layer.

In order to improve the short circuit current density of the stacked photoelectric conversion device to a higher degree, it is important to strike a balance between the short circuit current densities of the stacked photoelectric conversion element layers at a higher level. Since the first and second photoelectric conversion element layers are different in sensitivity to wavelengths of light, the first photoelectric conversion element layer and the intermediate layer need to have uneven surfaces of different sizes (Ry) on the light receiving side to obtain good photoelectric conversion efficiency in both of the first and second photoelectric conversion element layers.

Under these circumstances, the inventors of the present invention have found that the short circuit current density of the stacked photoelectric conversion device is improved by forming an uneven surface on the light receiving side of the first photoelectric conversion element layer and further forming an uneven surface, which is finer than that of the first photoelectric conversion element layer, on the intermediate layer. Thus, the present invention has been achieved.

The stacked photoelectric conversion device according to the present invention comprises at least two photoelectric conversion element layers sandwiched between a first electrode layer and a light receiving second electrode layer, and at least one intermediate layer sandwiched between any two of said at least two photoelectric conversion element layers, and the intermediate layer has uneven surfaces on a light receiving side and a light outgoing side, the uneven surface on the latter having a greater average level difference than that on the former. In other words, the intermediate layer sandwiched between the photoelectric conversion element layers and the photoelectric conversion element layer adjacent to the first electrode layer side of the intermediate layer have uneven surfaces on the light receiving side, respectively, the uneven surface of the photoelectric conversion element layer having greater average level difference than that of the intermediate layer.

The average level difference mentioned in the present invention is the same as defined above. The uneven surface may have any shape such as a cone, a triangular pyramid, quadrangular pyramid or a rib (ridge). The shape of the uneven surface is not particularly limited.

The photoelectric conversion element layer adjacent to the light outgoing side (the first electrode layer side) of the intermediate layer preferably includes an uneven surface having Ry of 1 to 100 μm (preferably 1 to 10 μm) on the light receiving side. Thereby, reflection of light of long wavelengths is prevented and the short circuit current density is improved. Ry has a great influence on the anti-reflection effect. Ry of less than 1 μm is not preferable because the anti-reflection effect with respect to the light of long wavelengths becomes insufficient. On the other hand, Ry of greater than 100 μm is not preferable because it causes mechanical and electrical problems on the second photoelectric conversion element layer and sufficient yield cannot be obtained.

The intermediate layer sandwiched between the photoelectric conversion element layers preferably includes an uneven surface having Ry of 0.1 to 0.7 μm (preferably 0.3 to 0.5 μm) on the light receiving side. Thereby, an optical path length in the second photoelectric conversion element layer increases, which offers improvement in short circuit current density. If Ry is less than 0.1 μm or greater than 0.7 μm, the increase in optical path length is not expected. Further, since the second photoelectric conversion element layer is formed directly on the uneven surface of the intermediate layer, mechanical and electric characteristics of the device are easily influenced by the uneven surface of the intermediate layer than that of the first photoelectric conversion element layer. Moreover, a short circuit easily occurs when Ry is greater than 0.7 μm.

The photoelectric conversion element layer adjacent to the light outgoing side (the first electrode layer side) of the intermediate layer preferably includes an uneven surface formed by etching on the light receiving side. By etching, the uneven surface can be formed at a lower cost as compared with mechanical or physical techniques.

The intermediate layer sandwiched between the photoelectric conversion element layers preferably includes an uneven surface formed by etching on the light receiving side. If the intermediate layer is thickened, the uneven surface can be formed more easily. However, the thick intermediate layer absorbs more light by itself, which reduces light transmittance. By etching, the uneven surface can be formed to have an appropriate shape for increasing the optical path length in the second photoelectric conversion element layer without thickening the intermediate layer.

In general, the more photoelectric conversion element layers the stacked photoelectric conversion device includes, the more an open-circuit voltage, which is the sum of the open-circuit voltages of the photoelectric conversion element layers, is improved. However, since the short circuit current is limited by the lowest short circuit current value of the photoelectric conversion element layers, substantial improvement in current value is not expected.

In order to obtain the maximum photoelectric conversion efficiency, it is preferred to form two photoelectric conversion element layers. That is, the second and first photoelectric conversion element layers are preferably arranged in descending order of semiconductor band gap (Eg) from the light receiving side.

Accordingly, the stacked photoelectric conversion device of the present invention preferably includes a support substrate, a first electrode layer, a first photoelectric conversion element layer, an intermediate layer, a second photoelectric conversion element layer and a light receiving second electrode layer stacked in this order, or includes a first electrode layer, a first photoelectric conversion element layer, an intermediate layer, a second photoelectric conversion element layer and a light receiving second electrode layer stacked in this order. Thereby, substrates of various kinds may be used and the stacked photoelectric conversion device can be manufactured with flexibility at a lower cost.

Regarding the stacked photoelectric conversion device according to the present invention, the photoelectric conversion element layer adjacent to the first electrode layer side of the intermediate layer is preferably made of a crystalline silicon substrate and the photoelectric conversion element layer adjacent to the second electrode layer side of the intermediate layer is preferably made of amorphous silicon. By using the silicon materials which have been mass-produced as materials for electronic components, cost reduction is expected.

Hereinafter, explanation is given of the results of the preliminary experiments performed by the inventors in connection with a relationship of the uneven surfaces on the light receiving side of the intermediate layer and the photoelectric conversion element layer adjacent to the first electrode layer side of the intermediate layer with the short circuit current density of the photoelectric conversion element layer contacting thereto.

More specifically, stacked photoelectric conversion devices were formed in the same manner as the manufacture of those shown in FIGS. 3 and 4 except that Ry of the uneven surface on the light receiving side of the first photoelectric conversion element layer was varied. Then, the short circuit current densities of the stacked photoelectric conversion devices and the second photoelectric conversion element layers were measured. The obtained results are shown in Table 3.

TABLE 3

| Ry of first photoelectric conversion element layer ($\mu$m) | Ry of intermediate layer ($\mu$m) | Short circuit current density (mA/cm$^2$) | |
|---|---|---|---|
| | | Stacked photoelectric conversion device | Second photoelectric conversion element layer |
| 0.5 | 0.1 | 12.9 | 13.1 |
| 1 | 0.1 | 13.7 | 13.8 |
| 1 | 0.3 | 13.8 | 14.1 |
| 1 | 0.5 | 13.9 | 14.1 |
| 1 | 0.7 | 13.9 | 14.0 |
| 10 | 0.1 | 13.9 | 13.9 |
| 10 | 0.3 | 14.1 | 14.1 |
| 10 | 0.5 | 14.1 | 14.1 |
| 10 | 0.7 | 14.0 | 14.0 |
| 10 | 1.0 | 13.5 | 13.5 |
| 50 | 0.1 | 13.7 | 13.8 |
| 50 | 0.3 | 13.8 | 14.0 |
| 50 | 0.5 | 13.7 | 14.0 |
| 50 | 0.7 | 13.6 | 13.9 |
| 100 | 0.1 | 13.6 | 13.8 |
| 100 | 0.3 | 13.7 | 14.0 |
| 100 | 0.5 | 13.7 | 14.0 |
| 100 | 0.7 | 13.6 | 13.9 |
| 100 | 1.0 | 13.4 | 13.5 |

From the results shown in Table 3, it is found that the short circuit current density of the stacked photoelectric conversion device is improved by forming the uneven surface on the light receiving side of the first photoelectric conversion element layer and further forming the uneven surface, which is finer than that of the first photoelectric conversion element layer, on the light receiving side of the intermediate layer.

Then, the stacked photoelectric conversion device according to the present invention and the method for manufacturing the same will be detailed with reference to the figures, but the invention is not limited thereto.

Embodiment 1

Figure 1:
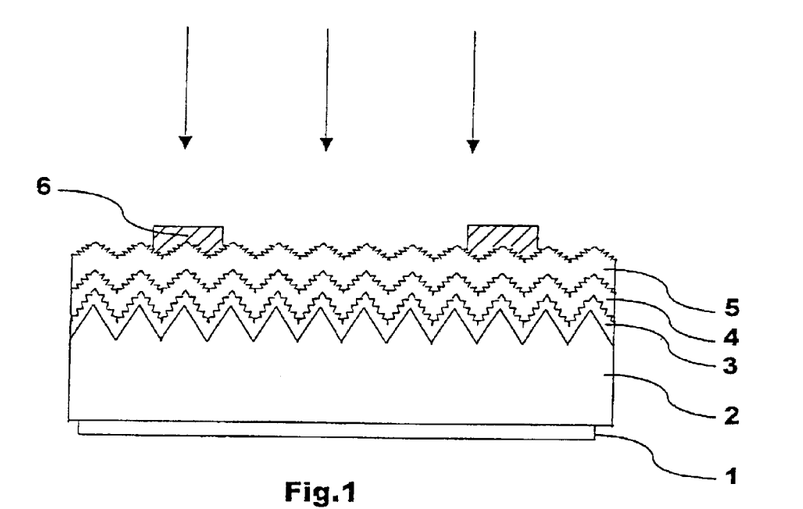
FIG. 1 is a schematic sectional view illustrating an example of a stacked photoelectric conversion device according to the present invention (Example 1)

FIG. 1 is a schematic sectional view illustrating an example of a stacked photoelectric conversion device according to the present invention. From the opposite side of the light receiving side, a first electrode layer 1, a first photoelectric conversion element layer 2, an intermediate layer 3, a second photoelectric conversion element layer 4, a second electrode layer 5 and a comb-shaped electrode 6 are stacked in this order. The first photoelectric conversion element layer 2 and the intermediate layer 3 have uneven surfaces on the light receiving side, respectively. Arrows in the figure signifies light.

As a substrate for the first photoelectric conversion element layer 2, a semiconductor substrate is prepared. The first photoelectric conversion element layer 2 is formed thereon.

As the semiconductor substrate, a single crystalline silicon substrate, polycrystalline silicon substrate and the like may be used, among which the single crystalline silicon substrate is suitably used. It is preferred that the orientation of the single crystalline silicon substrate is not (111), but (100). Conductivity type thereof may be either n or p.

Before the formation of the first photoelectric conversion element layer 2, it is preferred to wash and etch the semiconductor substrate. For example, a semiconductor substrate of about 450 $\mu$m thick is subjected to RCA wash and etched by using a mixture solution of hydrofluoric acid/nitric acid until the thickness is reduced to about 350 $\mu$m.

Then, an uneven surface is formed on the light receiving side of the semiconductor substrate. The formation of the uneven surface may be carried out by a known technique such as wet etching using an alkaline solution, dry etching by plasma discharge and the like. However, wet etching is preferable since the uneven surface is formed at a lower cost.

More specifically, the semiconductor substrate is immersed into an aqueous alkaline solution heated to about 75 to 90° C. (containing several % of alkali metal such as Na and K) such that the surface is lightly dissolved. At this time, the size of the unevenness can be controlled by adjusting etching conditions such as temperature and time or adding about 0.1 to 20% of an organic solvent such as isopropyl alcohol (IPA) to the aqueous alkaline solution.

For example, an aqueous alkaline solution containing 2% of sodium hydroxide and about 5 to 10% of IPA is heated to about 82° C. and an n-type single crystalline silicon substrate is immersed therein for about 30 minutes. Thereby, the uneven surface having Ry of about 10 μm is formed entirely on the light receiving side of the n-type single crystalline silicon substrate.

On the uneven surface on the light receiving side of the semiconductor substrate, a p-type or n-type semiconductor layer is formed if the conductivity type of the semiconductor substrate is n-type or p-type. The semiconductor layer may be formed by a known technique such as gas diffusion, impurity injection by ion implantation or deposition by plasma enhanced CVD.

The semiconductor substrate having the uneven surface on the light receiving side is preferably subjected to RCA wash in advance to remove alkaline substances and organic substances adhered thereto.

More specifically, the n-type semiconductor substrate is heated to about 950 to 1000° C. in nitrogen gas atmosphere in an oven and boron is diffused over the n-type semiconductor substrate by using boron tribromide ($BBr_3$) as a diffusion source to form a p-type semiconductor layer around the n-type semiconductor substrate. Then, nitrogen gas is replaced with oxygen gas to form a silicon oxide film of 0.1 to 0.2 μm thick around the p-type semiconductor layer.

Then, one surface of the n-type semiconductor substrate is covered with a resist film and the silicon oxide film and the p-type semiconductor layer on the other surface are removed by etching using a mixture solution of hydrofluoric acid/nitric acid. Then, the resist film is removed. Using the silicon oxide film protected by the resist film as a protection film, phosphorus is diffused by using phosphoryl trichloride ($POCl_3$) to form a back surface field (BSF) layer made of an $n^+$-type semiconductor only on the first electrode layer side of the n-type semiconductor substrate. After the phosphorus diffusion, the silicon oxide film is removed by using hydrofluoric acid. Thereby, the first photoelectric conversion element layer 2 is formed on the n-type semiconductor substrate.

Then, the first electrode layer 1 is formed on the surface of the semiconductor substrate opposite to the surface on which the first photoelectric conversion element layer 2 is formed. Material for the electrode is not limited and, for example, titanium (Ti)/palladium (Pd)/silver (Ag) may be used. The electrode may be formed by a known technique such as electron beam deposition, sputtering or screen printing in which paste of electrode material (e.g., silver) is applied. The first electrode layer may have a thickness of about 500 to 1000 nm.

Subsequently, the intermediate layer 3 is formed on the first photoelectric conversion element layer 2.

The intermediate layer 3 is preferably made of a conductive oxide. Thereby, electrical junction between the first and second photoelectric conversion element layers and a fill factor of the stacked photoelectric conversion device are improved. For example, a translucent conductive oxide such as zinc oxide, ITO (indium oxide containing several wt % of tin) and tin dioxide ($SnO_2$) may be used. These materials are preferable because their reflection indices are about 2.0 and effective optical effect such as interface reflection is expected. Although it depends on the formation method, zinc oxide having excellent resistance to hydrogen plasma is particularly preferable in consideration that the intermediate layer is exposed to hydrogen plasma after the formation thereof.

The conductive oxide, zinc oxide in particular, may be doped with dopants such as gallium (Ga), aluminum (Al), boron (B), indium (I), scandium (Sc), silicon (Si), titanium (Ti) and zirconium (Zr). The dope amount is preferably about 1 to 10 wt %.

The thickness of the intermediate layer is about 5 to 500 nm, preferably 10 to 100 nm. The intermediate layer less than 5 nm thick is not preferable because it is difficult to control the thickness uniform and yield decreases. On the other hand, the intermediate layer greater than 500 nm thick is not preferable because light absorption by the intermediate layer increases and the amount of light reaching the first photoelectric conversion element layer decreases.

The intermediate layer 3 may be formed by a known technique such as sputtering or vacuum deposition. Conditions thereof can suitably be selected.

For example, the semiconductor substrate provided with the first photoelectric conversion element layer 2 is placed in a sputtering apparatus and heated to 200° C. Then, total pressure in the apparatus is adjusted to 0.8 Pa and DC bias of 500 V is applied between the substrate and a cathode (using zinc oxide doped with 5% gallium as a target). Thereby, the intermediate layer of 500 nm thick is formed.

Then, an uneven surface is formed on the light receiving side of the intermediate layer 3. The uneven surface may be formed by a known technique such as wet etching using an aqueous acid solution or dry etching by plasma discharge. However, wet etching is preferable because the uneven surface is formed at a lower cost.

For example, the semiconductor substrate provided with the intermediate layer 3 is immersed in an aqueous acid solution of 5 wt % for about 150 seconds. Thereby, the uneven surface having Ry of about 300 nm is formed entirely on the light receiving side of the intermediate layer 3.

Then, on the uneven surface on the light receiving side of the intermediate layer 3, the second photoelectric conversion element layer 4 is formed. Material for the second photoelectric conversion element layer 4 may be a valence-controlled silicon material such as a n-, i- or p-type amorphous silicon and microcrystalline silicon, among which amorphous silicon is particularly preferable. Since the forbidden band width of the amorphous silicon is greater than that of the crystalline silicon, it is preferred to use the amorphous silicon for the photoelectric conversion element layer on the light receiving side (window side) of the stacked solar cell. The thickness thereof is about 100 to 500 nm.

The second photoelectric conversion element layer 4 may be formed by a known technique, for example, plasma enhanced CVD using a flat-shaped plasma enhanced CVD apparatus.

More specifically, the semiconductor substrate provided with the intermediate layer 3 having the uneven surface on the light receiving side is placed in the flat-shaped plasma enhanced CVD apparatus and heated. Then, high frequency power is applied between the substrate and a cathode to generate plasma, thereby forming thin amorphous silicon films. Conditions thereof may suitably be selected. Detailed conditions are shown in Table 4 in Example 1.

Subsequently, the second electrode layer 5 is formed on the second photoelectric conversion element layer 4. Material for the electrode is not particularly limited as long as it is transparent. For example, ITO may be used. The electrode may be formed by a known technique, for example, electron beam deposition or sputtering. Conditions thereof may suitably be selected. The thickness thereof is about 50 to 80 nm.

For example, the semiconductor substrate provided with the second photoelectric conversion element layer 4 is placed in a sputtering apparatus and heated to 220° C. Then, oxygen and argon are supplied at flow rates of 1.4 sccm and 250 sccm, respectively, gas pressure in the apparatus is adjusted to 3.8 Pa and DC bias of 450 V is applied between the substrate and a cathode (ITO). Thereby, the second electrode layer 5 of 60 nm thick is formed.

Thereafter, the comb-shaped electrode 6 is formed on the second electrode layer 5. Material for the comb-shaped electrode 6 is not particularly limited. However, it is preferred to use a material of low resistance so that electric current can be collected effectively. For example, silver may be used. The comb-shaped electrode may be formed by a known technique such as electron beam deposition or sputtering using a metal mask. Conditions thereof may suitably be selected. The thickness thereof is about 500 to 1000 nm.

More specifically, the semiconductor substrate provided with the second electrode layer 5 is placed in a sputtering apparatus together with a metal mask arranged thereon and heated to 180° C. Then, sterling silver as a deposition source is fused by electron beam irradiation to deposit silver selectively on the second electrode layer 5. Thereby, the comb-shaped electrode 6 of 500 nm thick is formed. Thus, a stacked photoelectric conversion device according to the present invention is obtained.

Embodiment 2

Figure 2:
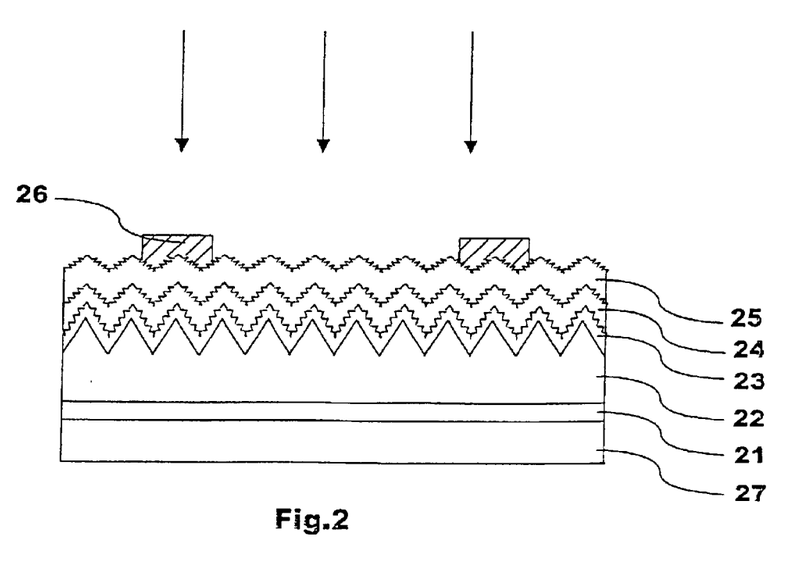
FIG. 2 is a schematic sectional view illustrating an example of a stacked photoelectric conversion device according to the present invention (Example 2)

FIG. 2 is a schematic sectional view illustrating an example of a stacked photoelectric conversion device according to the present invention. From the opposite side to the light receiving side, a support substrate 27, a first electrode layer 21, a first photoelectric conversion element layer 22, an intermediate layer 23, a second photoelectric conversion element layer 24, a second electrode layer 25 and a comb-shaped electrode 26 are stacked in this order. The first photoelectric conversion element layer 22 and the intermediate layer 23 have uneven surfaces on the light receiving side, respectively. Arrows in the figure signify light.

The support substrate 27 may be a glass substrate (e.g., manufactured by Corning; No. 7059), a metal substrate, a ceramic substrate, a silicon substrate or a film substrate. Also available are these substrates provided with a metal film or an insulating material deposited thereon.

The support substrate 27 is preferably washed with pure water before the formation of the first electrode layer 21.

At the outset, the first electrode layer 21 is formed on the support substrate 27. Material for the first electrode layer 21 is not particularly limited and either of metal and conductive metal oxide may be used in a single layer or a multilayer. For example, silver (Ag)/zinc oxide (ZnO) may be used. The first electrode layer may be formed by a known technique, for example, electron beam deposition, MOCVD, sputtering or spraying into a thickness of about 300 to 1000 nm, preferably about 800 to 1000 nm.

For example, the support substrate 27 is placed in a deposition apparatus and heated to 180° C. Electron beam is applied to sterling silver as a target to deposit silver to a thickness of 100 nm. Further, the substrate temperature is raised to 220° C., oxygen is supplied at a flow rate of 42 sccm and electron beam is applied to zinc oxide as a target to deposit zinc oxide to a thickness of 50 nm. Thus, the first electrode layer 21 is formed.

On the first electrode layer 21, the first photoelectric conversion element layer 22 is formed. Material for the first photoelectric conversion element layer 22 may be a valence-controlled silicon material such as a n-, i- or p-type crystalline silicon and microcrystalline silicon. Among them, crystalline silicon is preferable.

The first photoelectric conversion element layer 22 may be formed by a known technique such as plasma enhanced CVD using a flat-shaped plasma enhanced CVD apparatus.

More specifically, the support substrate 27 provided with the first electrode layer 21 is placed in the flat-shaped plasma enhanced CVD apparatus and heated. Then, high frequency power is applied between the substrate and a cathode to generate plasma, thereby forming thin crystalline silicon films. Conditions thereof may suitably be selected. Detailed conditions are shown in Table 6 in Example 2.

Thus, the first photoelectric conversion element layer including an uneven surface having Ry of about 1 $\mu$m on the light receiving side is formed.

In the same manner as Embodiment 1, the intermediate layer 23 having an uneven surface on the light receiving side, the second photoelectric conversion element layer 24, the second electrode layer 25 and the comb-shaped electrode 26 are formed to obtain a stacked photoelectric conversion device according to the present invention.

EXAMPLES

Hereinafter, the present invention will be described in further detail by way of examples and comparative examples. However, the present invention is not limited thereto.

Example 1

A stacked solar cell comprising a stacked photoelectric conversion device of FIG. 1 according to the present invention was manufactured and evaluated. FIG. 1 is a schematic sectional view illustrating an example of the stacked photoelectric conversion device according to the present invention, in which a first electrode layer 1, a first photoelectric conversion element layer 2, an intermediate layer 3, a second photoelectric conversion element layer 4, a second electrode layer 5 and a comb-shaped electrode 6 are stacked in this order from the opposite side of the light receiving side. The first photoelectric conversion element layer 2 and the intermediate layer 3 have uneven surfaces on the light receiving side, respectively. Arrows in the figure signify light.

As a substrate for the first photoelectric conversion element layer 2, a (100)-oriented n-type single crystalline silicon substrate (about 450 $\mu$m thick) was prepared. The substrate was subjected to RCA wash and etched by using a mixture solution of hydrofluoric acid/nitric acid until the thickness thereof was reduced to about 350 $\mu$m.

Then, an uneven surface was formed on the light receiving side of the n-type single crystalline silicon substrate by wet etching using an alkaline solution. More specifically, an aqueous alkaline solution containing about 2% of sodium hydroxide was heated to 80 to 85° C. and the n-type single crystalline silicon substrate was immersed therein for about 30 minutes. Thereby, the uneven surface having Ry of about 10 $\mu$m was formed entirely on the light receiving side of the n-type single crystalline silicon substrate.

Then, RCA wash was performed to remove alkaline substances and organic substances adhered to the surface of the n-type semiconductor substrate and a p-type semiconductor layer was formed by gas diffusion. More specifically, the n-type semiconductor substrate was heated to 950 to 1000° C. in nitrogen gas atmosphere in an oven and boron was diffused over the n-type semiconductor substrate by using boron tribromide ($BBr_3$) as a diffusion source to form the p-type semiconductor layer around the n-type semiconductor substrate. Further, nitrogen gas was replaced with oxygen gas to form a silicon oxide film of 0.1 to 0.2 μm around the p-type semiconductor layer.

Subsequently, one surface of the n-type semiconductor substrate was covered with a resist film to remove the silicon oxide film and the p-type semiconductor layer on the other surface by etching using a mixture solution of hydrofluoric acid/nitric acid. Then, the resist film was removed by using a resist stripper. Further, using the silicon oxide film protected by the resist film as a protection film, phosphorus was diffused by using phosphoryl trichloride ($POCl_3$) to form a back surface field (BSF) layer made of an $n^+$-type semiconductor only on the first electrode layer side of the n-type semiconductor substrate. After the phosphorus diffusion, the silicon oxide film was removed by using hydrofluoric acid. Thereby, the first photoelectric conversion element layer 2 was formed on the n-type semiconductor substrate.

Then, the first electrode layer 1 made of titanium (Ti)/palladium (Pd)/silver (Ag) was formed on the n-type semiconductor substrate by electron beam deposition.

Subsequently, the intermediate layer 3 made of zinc oxide containing gallium (Ga) was formed by sputtering. More specifically, the n-type semiconductor substrate provided with the first photoelectric conversion element layer 2 was placed in a sputtering apparatus and heated to 200° C. Then, total pressure in the apparatus was adjusted to 0.8 Pa and DC bias of 500 V was applied between the substrate and a cathode (using zinc oxide doped with gallium of 5% as a target). Thereby, the intermediate layer of about 500 nm thick was formed.

Then, an uneven surface was formed on the light receiving side of the intermediate layer 3 by wet etching. More specifically, the n-type semiconductor substrate provided with the intermediate layer 3 was immersed in an aqueous acid solution of 0.5 wt % for about 150 seconds. Thereby, the uneven surface having Ry of about 300 nm was formed entirely on the light receiving side of the intermediate layer 3.

Subsequently, thin amorphous silicon films each having conductivity types of n, i and p were formed in sequence on the intermediate layer 3 by plasma enhanced CVD to obtain the second photoelectric conversion element layer 4. More specifically, the n-type single crystalline silicon substrate provided with the intermediate layer 3 having the uneven surface on the light receiving side was placed in a flat-shaped plasma enhanced CVD apparatus and heated under conditions described in Table 4. Then, high frequency power was applied between the substrate and a cathode to generate plasma, thereby forming the thin amorphous silicon films.

TABLE 4

|  | Applied power (W) | Gas pressure (Pa) | Substrate temperature (° C.) | Flow rate (sccm) | | | | Thickness (nm) |
| --- | --- | --- | --- | --- | --- | --- | --- | --- |
|  |  |  |  | Silane | Hydrogen | Phosphine | Diborane |  |
| n-layer | 25 | 40 | 200 | 180 | 300 | 0.001 | — | 30 |
| i-layer | 30 | 66 | 200 | 40 | 130 | — | — | 400 |
| p-layer | 25 | 66 | 200 | 200 | 450 | — | 0.003 | 20 |

Then, the second electrode layer 5 was formed on the second photoelectric conversion element layer 4 by sputtering. More specifically, the semiconductor substrate provided with the second photoelectric conversion element layer 4 was placed in a sputtering apparatus and heated to 220° C. Then, oxygen and argon were supplied at flow rates of 1.4 sccm and 250 sccm, respectively, gas pressure in the apparatus was adjusted to 3.8 Pa and DV bias of 450 V was applied between the substrate and a cathode (ITO). Thereby, the second electrode layer 5 of 60 nm thick was formed.

Next, the comb-shaped electrode 6 was formed on the second electrode layer 5 by electron beam deposition using a metal mask. More specifically, the n-type semiconductor substrate provided with the second electrode layer 5 was placed in a sputtering apparatus together with a metal mask arranged thereon and heated to 180° C. Then, sterling sliver as a deposition source was fused by electron beam irradiation to deposit silver selectively on the second electrode layer 5. Thereby, the comb-shaped electrode 6 of 500 nm thick was formed.

To a stacked solar cell comprising the thus manufactured stacked photoelectric conversion device, pseudo-light of AM 1.5 and 100 mW/cm² was applied to measure the conversion efficiency in optical energy. The obtained results are shown in Table 5.

Comparative Example 1

A stacked solar cell comprising a stacked photoelectric conversion device was manufactured in the same manner as Example 1 except that the uneven surface was formed not on the light receiving side of the first photoelectric conversion element layer, but only on the light receiving side of the intermediate layer. Then, the conversion efficiency in optical energy was measured. The obtained results are shown in Table 5.

Comparative Example 2

A stacked solar cell comprising a stacked photoelectric conversion device was manufactured in the same manner as Example 1 except that the uneven surface was formed only on the light receiving side of the first photoelectric conversion element layer and the surface on the intermediate layer on the light receiving side was kept flat. Then, the conversion efficiency in optical energy was measured. The obtained results are shown in Table 5.

TABLE 5

|  | Short circuit current density (mA/cm$^2$) | Open-circuit voltage (V) | Fill factor (-) | Conversion efficiency (%) |
| --- | --- | --- | --- | --- |
| Ex. 1 | 14.1 | 1.44 | 0.652 | 13.2 |
| Com. Ex. 1 | 13.4 | 1.44 | 0.649 | 12.5 |
| Com. Ex. 2 | 13.7 | 1.44 | 0.651 | 12.8 |

The results shown in Table 5 indicate that higher short circuit current density is obtained by forming the uneven surfaces on the light receiving side of the first photoelectric conversion element layer and the intermediate layer, respectively.

The stacked solar cell of Example 1 includes two photoelectric conversion element layers. However, it is expected that a stacked solar cell including more photoelectric conversion element layers also shows the same effect.

Example 2

A stacked solar cell comprising the stacked photoelectric conversion device of FIG. 2 according to the present invention was manufactured and evaluated. FIG. 2 is a schematic sectional view illustrating an example of the stacked photoelectric conversion device according to the present invention, in which a support substrate 27, a first electrode layer 21, a first photoelectric conversion element layer 22, an intermediate layer 23, a second photoelectric conversion element layer 24, a second electrode layer 25 and a comb-shaped electrode 26 are stacked in this order from the opposite side of the light receiving side. The first photoelectric conversion element layer 22 and the intermediate layer 23 have uneven surfaces on the light receiving side, respectively. Arrows in the figure signify light.

As the support substrate 27, a glass substrate (manufactured by Corning, No. 7059) was used and washed with pure water.

Then, silver and zinc oxide (ZnO) were deposited on the support substrate 27 in sequence by electron beam deposition to form the first electrode layer 21. More specifically, the support substrate 27 was placed in a deposition apparatus and heated to 180° C. Then, electron beam was applied to sterling silver as a target to deposit silver to a thickness of 100 nm. Further, the substrate temperature was raised to 220° C., oxygen was supplied at a flow rate of 42 sccm and electron beam was applied to zinc oxide as a target to deposit zinc oxide to a thickness of 50 nm. Thereby, the first electrode layer 21 was formed.

Then, thin crystalline silicon films each having conductivity types of n-, i- and p were formed in sequence on the first electrode layer 21 by plasma enhanced CVD to obtain the first photoelectric conversion element layer 22. More specifically, the support substrate 27 provided with the first electrode layer 21 was placed in a flat-shaped plasma enhanced CVD apparatus and heated under the conditions described in Table 6. Then, high frequency power was applied between the substrate and a cathode to generate plasma, thereby forming the thin crystalline silicon films. Thus, the first photoelectric conversion element layer 22 including an uneven surface having Ry of about 1 μm on the light receiving side was obtained.

TABLE 6

|  | Applied power (W) | Gas pressure (Pa) | Substrate temperature (° C.) | Flow rate (sccm) | | | | Thickness (nm) |
| --- | --- | --- | --- | --- | --- | --- | --- | --- |
|  |  |  |  | Silane | Hydrogen | Phosphine | Diborane |  |
| n-layer | 70 | 40 | 250 | 4 | 100 | 0.001 | — | 20 |
| i-layer | 52 | 213 | 350 | 20 | 800 | — | — | 4000 |
| p-layer | 70 | 53 | 220 | 8 | 450 | — | 0.003 | 30 |

Thereafter, the intermediate layer 23 having an uneven surface on the light receiving side, the second photoelectric conversion element layer 24, the second electrode layer 25 and the comb-shaped electrode 26 were formed in the same manner as Example 1 to obtain the stacked photoelectric conversion device according to the present invention.

To a stacked solar cell comprising the thus manufactured stacked photoelectric conversion device, pseudo-light of AM 1.5 and 100 mW/cm$^2$ was applied to measure the conversion efficiency in optical energy. The obtained results are shown in Table 7.

Comparative Example 3

A stacked solar cell comprising a stacked photoelectric conversion device was manufactured in the same manner as Example 2 except that the uneven surface was formed not on the light receiving side of the first photoelectric conversion element layer, but only on the light receiving side of the intermediate layer. Then, the conversion efficiency in optical energy was measured. The obtained results are shown in Table 7.

Comparative Example 4

A stacked solar cell comprising a stacked photoelectric conversion device was manufactured in the same manner as Example 2 except that the uneven surface was formed only on the light receiving side of the first photoelectric conversion element layer and the surface of the intermediate layer on the light receiving side was kept flat. Then, the conversion efficiency in optical energy was measured. The obtained results are shown in Table 7.

TABLE 7

|  | Short circuit current density (mA/cm$^2$) | Open-circuit voltage (V) | Fill factor (-) | Conversion efficiency (%) |
|---|---|---|---|---|
| Ex. 2 | 13.8 | 1.41 | 0.649 | 12.6 |
| Com. Ex. 3 | 13.0 | 1.41 | 0.647 | 11.9 |
| Com. Ex. 4 | 13.4 | 1.41 | 0.648 | 12.2 |

The results shown in Table 7 indicate that higher short circuit current density is obtained by forming the uneven surfaces on the light receiving side of the first photoelectric conversion element layer and the intermediate layer, respectively.

The stacked solar cell of Example 2 includes two photoelectric conversion element layers. However, it is expected that a stacked solar cell including more photoelectric conversion element layers also shows the same effect.

According to the stacked photoelectric conversion device of the present invention, the intermediate layer has uneven surfaces on the light receiving side and the light outgoing side, the uneven surface on the latter having a greater average level difference than that on the former.

In other words, the first photoelectric conversion element layer includes an uneven surface on the light receiving side and the intermediate layer also includes an uneven surface on the light receiving side having smaller Ry (average level difference) than that of the first photoelectric conversion element layer. Therefore, external current density increases and the amount of power generated per unit area increases. This leads to the cost reduction in the power generation.

What is claimed is:

1. A stacked photoelectric conversion device comprising at least two photoelectric conversion element layers sandwiched between a first electrode layer and a light receiving second electrode layer, and at least one intermediate layer sandwiched between any two of said at least two photoelectric conversion element layers, wherein the intermediate layer has uneven surfaces on a light receiving side and a light outgoing side, the uneven surface on the latter having a greater average level difference than that on the former, and wherein adjacent peaks on the outgoing side of the intermediate layer are spaced further from one another than are adjacent peaks on the light receiving side of the intermediate layer.

2. A stacked photoelectric conversion device according to claim 1, wherein the photoelectric conversion element layer adjacent to the light outgoing side of the intermediate layer includes an uneven surface having an average level difference of 1 to 100 µm on the light receiving side.

3. A stacked photoelectric conversion device according to claim 1, wherein the photoelectric conversion element layer adjacent to the light outgoing side of the intermediate layer includes an uneven surface formed by etching on the light receiving side.

4. A stacked photoelectric conversion device according to claim 1, wherein the intermediate layer includes an uneven surface having an average level difference of 0.1 to 0.7 µm on the light receiving side.

5. A stacked photoelectric conversion device according to claim 1, wherein the intermediate layer includes an uneven surface formed by etching on the light receiving side.

6. A stacked photoelectric conversion device according to claim 1 including a support substrate, a first electrode layer, a first photoelectric conversion element layer, an intermediate layer, a second photoelectric conversion element layer and a light receiving second electrode layer stacked in this order, or including a first electrode layer, a first photoelectric conversion element layer, an intermediate layer, a second photoelectric conversion element layer and a light receiving second electrode layer stacked in this order.

7. A stacked photoelectric conversion device according to claim 1, wherein the at least two photoelectric conversion element layers are semiconductor layers.

8. A stacked photoelectric conversion device comprising:
at least two photoelectric conversion element layers sandwiched between a first electrode layer and a light receiving second electrode layer,
at least one intermediate layer sandwiched between any two of said at least two photoelectric conversion element layers, wherein the intermediate layer has uneven surfaces on a light receiving side and a light outgoing side, the uneven surface on the latter having a greater average level difference than that on the former, and
wherein the intermediate layer is made of a conductive oxide.

9. A stacked photoelectric conversion device according to claim 8, wherein the conductive oxide is zinc oxide.

10. A stacked photoelectric conversion device comprising:
at least two photoelectric conversion element layers sandwiched between a first electrode layer and a light receiving second electrode layer,
at least one intermediate layer sandwiched between any two of said at least two photoelectric conversion element layers, wherein the intermediate layer has uneven surfaces on a light receiving side and a light outgoing side, the uneven surface on the latter having a greater average level difference than that on the former,
a support substrate, a first electrode layer, a first photoelectric conversion element layer, an intermediate layer, a second photoelectric conversion element layer and a light receiving second electrode layer stacked in this order, or including a first electrode layer, a first photoelectric conversion element layer, an intermediate layer, a second photoelectric conversion element layer and a light receiving second electrode layer stacked in this order, and
wherein the first photoelectric conversion element layer is made of a crystalline silicon substrate and the second photoelectric conversion element layer is made of amorphous silicon.

11. A photoelectric conversion device comprising:
at least two photoelectric conversion element layers sandwiched between at least a first electrode layer and a light receiving second electrode layer,
at least one intermediate layer sandwiched between any two of said at least two photoelectric conversion element layers,
wherein the intermediate layer has uneven surfaces defined by adjacent peaks and valleys on both a light receiving side and a light outgoing side, and
wherein the uneven surface on the light outgoing side of the intermediate layer has a greater average level difference between adjacent peaks and valleys than does the uneven surface on the light receiving side of the intermediate layer, and wherein adjacent peaks on the outgoing side of the intermediate layer are spaced apart further from one another than are adjacent peaks on the light receiving side of the intermediate layer.

12. A stacked photoelectric conversion device according to claim 11, wherein the photoelectric conversion element layer adjacent to the light outgoing side of the intermediate layer includes an uneven surface having an average level difference of 1 to 100 μm on the light receiving side.

13. A stacked photoelectric conversion device according to claim 11, wherein the photoelectric conversion element layer adjacent to the light outgoing side of the intermediate layer includes an uneven surface formed by etching on the light receiving side.

14. A stacked photoelectric conversion device according to claim 11, wherein the intermediate layer includes an uneven surface having an average level difference of 0.1 to 0.7 μm on the light receiving side.

15. A stacked photoelectric conversion device according to claim 11, wherein the intermediate layer includes an uneven surface formed by etching on the light receiving side.

16. A photoelectric conversion device comprising:
   at least two photoelectric conversion element layers sandwiched between at least a first electrode layer and a light receiving second electrode layer,
   at least one intermediate layer sandwiched between any two of said at least two photoelectric conversion element layers,
   wherein the intermediate layer has uneven surfaces defined by adjacent peaks and valleys on both a light receiving side and a light outgoing side,
   wherein the uneven surface on the light outgoing side of the intermediate layer has a greater average level difference between adjacent peaks and valleys than does the uneven surface on the light receiving side of the intermediate layer, and
   wherein the intermediate layer comprises a conductive oxide.

* * * * *